US012606579B2

(12) United States Patent
Liu et al.

(10) Patent No.: US 12,606,579 B2
(45) Date of Patent: Apr. 21, 2026

(54) HALOGEN-FREE MOLYBDENUM-CONTAINING PRECURSORS FOR DEPOSITION OF MOLYBDENUM

(71) Applicant: Applied Materials, Inc., Santa Clara, CA (US)

(72) Inventors: Feng Q. Liu, San Jose, CA (US); Mark J. Saly, Santa Clara, CA (US); David Thompson, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 460 days.

(21) Appl. No.: 18/209,217

(22) Filed: Jun. 13, 2023

(65) Prior Publication Data

US 2024/0425536 A1 Dec. 26, 2024

(51) Int. Cl.
*C07F 11/00* (2006.01)
*C23C 16/40* (2006.01)
(Continued)

(52) U.S. Cl.
CPC .......... *C07F 11/005* (2013.01); *C23C 16/405* (2013.01); *H01L 21/0206* (2013.01);
(Continued)

(58) Field of Classification Search
CPC ................. C07F 11/005; C23C 16/405; C23C 16/45553; H01L 21/0206; H01L 21/02175;
(Continued)

(56) References Cited

U.S. PATENT DOCUMENTS 11,760,768 B2 * 9/2023 Barik ................ C23C 16/45527 427/255.394

OTHER PUBLICATIONS

Mouat et al, "Volatile Hexavalent Oxo-amidinate complexes: Molybdenum and Tungsten precursors for Atomic Layer Deposition", Feb. 26, 2016, Chemistry of Materials, pp. 1907-1919 (Year: 2016).*

* cited by examiner

*Primary Examiner* — Dale E Page
*Assistant Examiner* — Quovaunda Jefferson
(74) *Attorney, Agent, or Firm* — Kilpatrick Townsend & Stockton LLP

(57) ABSTRACT

Exemplary methods of semiconductor processing, such as methods of depositing a molybdenum-containing material on a substrate, may include providing a molybdenum-containing precursor to a processing region of a semiconductor processing chamber in which the substrate is located. The molybdenum-containing precursor may include a molybdenum complex according to Compound I:

Compound I

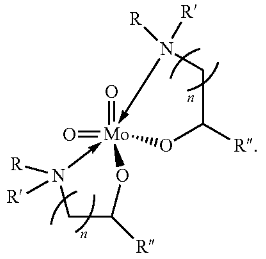

R may be methyl or ethyl, R' may be methyl or ethyl, R" may be methyl, ethyl, or propyl, and n may be equal to 1 or 2. Contacting the substrate with the molybdenum-containing precursor may deposit the molybdenum-containing material on the substrate.

20 Claims, 4 Drawing Sheets

(51) Int. Cl.
*H01L 21/02* (2006.01)
*H01L 21/3105* (2006.01)

(52) U.S. Cl.
CPC .. *H01L 21/02175* (2013.01); *H01L 21/02205* (2013.01); *H01L 21/02274* (2013.01); *H01L 21/3105* (2013.01)

(58) Field of Classification Search
CPC ......... H01L 21/02205; H01L 21/02274; H01L 21/3105
See application file for complete search history.

HALOGEN-FREE MOLYBDENUM-CONTAINING PRECURSORS FOR DEPOSITION OF MOLYBDENUM

TECHNICAL FIELD

The present technology relates to semiconductor processes and materials. More specifically, the present technology relates to halogen-free molybdenum-containing precursors and the related semiconductor processes and materials.

BACKGROUND

Integrated circuits are made possible by processes which produce intricately patterned material layers on substrate surfaces. Producing patterned material on a substrate requires controlled methods for forming and removing material. Material characteristics may affect how the device operates, and may also affect how the films are removed relative to one another. Precursors used in the deposition of molybdenum materials typically include molybdenum complexes with halogen-containing ligands. The halogen-containing ligands can chemically attack and damage existing layers on the substrate during the deposition process.

Thus, there is a need for molybdenum complexes free of halogen. These and other needs are addressed by the present technology.

SUMMARY

Exemplary methods and compositions relating to semiconductor processing may include halogen-free molybdenum-containing precursors according to Compound I:

Compound I

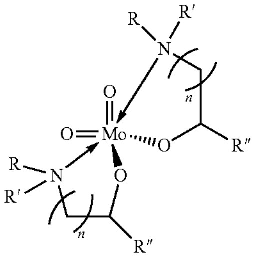

wherein R is methyl or ethyl, R' is methyl or ethyl, R" is hydrogen, methyl, ethyl, or propyl, and n equals 1 or 2.

In some embodiments, a molybdenum complex for use as a molybdenum-containing precursor may comprise Compound I. In some embodiments, R may be methyl, R' is methyl, R" is hydrogen, and n equals 1. Further, R may be methyl, R' is methyl, R" is hydrogen, and n equals 2. The molybdenum complex may have a vapor pressure at 100° C. of 0.1 Torr to 1 Torr.

Some embodiments of the present technology may encompass semiconductor processing methods. The methods may be for depositing a film and include providing a molybdenum-containing precursor that includes a molybdenum complex according to Compound I to a processing region of a semiconductor processing chamber. A substrate may be disposed within the processing region of the semiconductor processing chamber. The method may further include contacting the substrate with the molybdenum-containing precursor. The contacting may deposit a molybdenum-containing material on the substrate.

In some embodiments, the molybdenum-containing precursor is halogen-free. The molybdenum-containing material may include one or more of molybdenum metal, molybdenum oxide, molybdenum nitride, molybdenum carbide, molybdenum silicide, or molybdenum sulfide. The method may further include iteratively repeating the providing of the molybdenum-containing precursor and the contacting of the substrate to build the molybdenum-containing material to a thickness of 1 Å to 3000 Å. In some embodiments, the methods may further include providing a reactant to the processing region of the semiconductor processing chamber to react with the molybdenum-containing precursor to form the molybdenum-containing material. Alternatively, the methods may further include providing a reactant to the processing region of the semiconductor processing chamber; and forming plasma effluents of the reactant to react with the molybdenum-containing precursor to form the molybdenum-containing material. In either instance, the providing of the molybdenum-containing precursor and the contacting of the substrate may be performed simultaneously or sequentially. The reactant may include an oxidant. In some embodiments, the methods may further include annealing the molybdenum-containing material. In some embodiments, the molybdenum-containing material may extend into one or more features defined by the substrate. Alternatively, the methods may further include providing a reactant to the processing region of the semiconductor processing chamber; and forming plasma effluents of the reactant to react with the molybdenum-containing precursor to form the molybdenum-containing material. In either instance, the providing of the molybdenum-containing precursor and the contacting of the substrate may be performed simultaneously or sequentially. The reactant may include an oxidant. In some embodiments, the methods may further include annealing the molybdenum-containing material. In some embodiments, the molybdenum-containing material may extend into one or more features defined by the substrate.

Some embodiments of the present technology may encompass methods of forming a molybdenum complex. The methods may include reacting Y—O—CH(R")—$(CH_2)_n$ —NR(R') where Y is an alkali metal and $MoO_2X_2$ where X is a halogen in a dry, organic solvent to produce the molybdenum complex according to Compound I.

In some embodiments, the conditions of the reacting include a reaction temperature of 0° C. to 50° C. and a reaction time of 1 hour to 36 hours. Further, the method may include adding the Y—O—CH(R")—$(CH_2)_n$—NR(R') over time to the $MoO_2Cl_2$. The time of the adding of the Y—O—CH(R")—$(CH_2)_n$—NR(R') may be 5 minutes to 2 hours. Further, the method may further include filtering a product of the reacting and washing and drying the product to produce crystals comprising the molybdenum complex.

Such technology may provide numerous benefits over conventional systems and techniques. For example, embodiments of the present technology may form molybdenum-containing materials as layers or other structures on substrates using halogen-free molybdenum-containing precursors, which mitigates damage that would be caused by halogens in traditional molybdenum-containing precursors. This and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
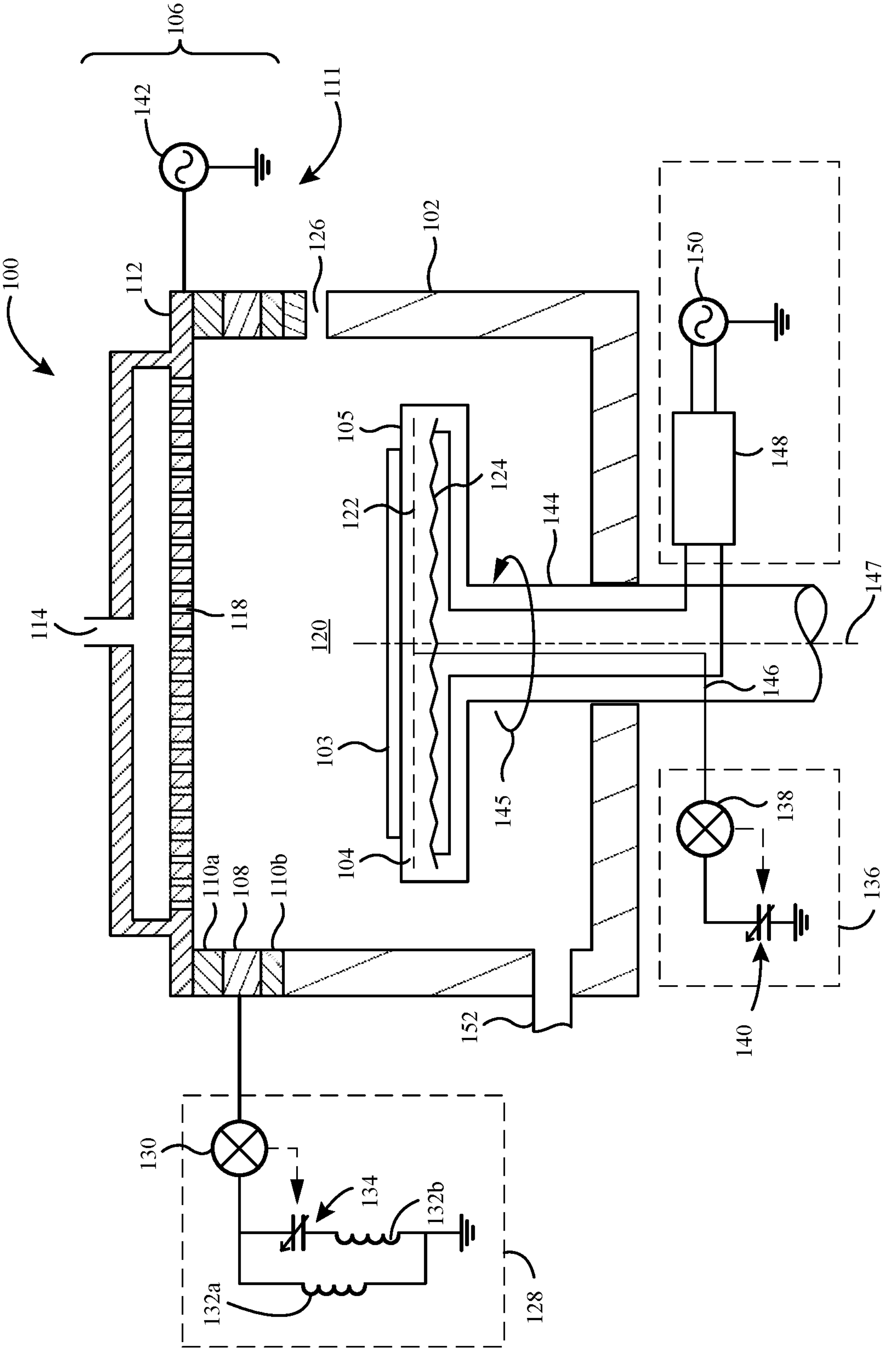
FIG. 1 shows a schematic cross-sectional view of an exemplary semiconductor processing chamber according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

The building of semiconductor devices is typically a bottom-up process where different materials are layered on top of each other to form a desired structure. The process for forming a new layer preferably has minimal to no impact on existing layers. The present technology seeks to reduce the potential damage caused when forming a molybdenum-containing material from a molybdenum-containing precursor by using a halogen-free molybdenum-containing precursor. Said halogen-free molybdenum-containing precursor comprises molybdenum complexes with aminoalcohol ligands. As used herein, a "halogen-free molybdenum-containing precursor" composition refers to said composition having 0.0 ppm halogen in the precursor molecules therein.

As previously discussed, conventional molybdenum complexes used as molybdenum-containing precursor when forming a molybdenum-containing material include halogens like chlorine. For example, molybdenum dichloride dioxide ($MoO_2Cl_2$) is a commonly used molybdenum complex. However, under deposition conditions, halogen ligands can be caustic to inorganic materials (e.g., low k dielectric such as silicon oxide, silicon carbide, silicon carbon oxide, silicon nitride, aluminum oxide, and the like) commonly used in semiconductor devices. Therefore, when forming layers or structures of molybdenum-containing materials when producing a semiconductor device, additional steps (e.g., masking) may be needed to protect existing layers and structures from potential damage from the halogen ligands. The present technology reduces, if not eliminates, the potential damage from the ligands by using a halogen-free molybdenum-containing precursor that comprises molybdenum complexes with aminoalcohol ligands.

Further, in some instances, the aminoalcohol ligands have structures that mitigate the formation of dimer and trimer structures that result in the precursor being a monomer which is beneficial for vapor pressure. Stated differently, the aminoalcohol ligands may have structures that mitigate the formation of metal centers having two or three molybdenum atoms coordinated together. The dimerization or trimerization in a molybdenum complex decreases the vapor pressure of the molybdenum complex, which requires higher processing ampoule temperatures in the related semiconductor processes. As discussed in more detail herein, structural components of the aminoalcohol ligands of the molybdenum complexes may be chosen to mitigate dimerization or trimerization, which may reduce processing ampoule temperatures to minimize precursor thermal decomposition in an ampoule during processing.

By using halogen-free molybdenum-containing precursor, the present technology may mitigate, if not prevent, the problems in any following integration processes and/or defects in the final devices caused by halogen-containing molybdenum complexes typically used in semiconductor processes. Further, the disclosed molybdenum complexes may preferably include aminoalcohol ligands that mitigate dimerization or trimerization, which may allow for lower processing temperatures. Although the remaining disclosure will routinely identify specific deposition processes utilizing the disclosed technology, and will describe one type of semiconductor processing chamber, it will be readily understood that the processes described may be performed in any number of semiconductor processing chambers. Accordingly, the technology should not be considered to be so limited as for use with these specific deposition processes or chambers alone. The disclosure will discuss one possible chamber that may be used to perform processes according to embodiments of the present technology before methods of semiconductor processing according to the present technology are described.

FIG. 1 shows a cross-sectional view of an exemplary semiconductor processing chamber system 100 according to some embodiments of the present technology. Semiconductor processing chamber 100 may be utilized to form film layers according to some embodiments of the present technology, although it is to be understood that the methods may similarly be performed in any chamber within which film formation may occur. The semiconductor processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the semiconductor processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the semiconductor processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110*a*, 110*b*, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a faceplate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the semiconductor processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power.

The lid assembly 106 and substrate support 104 of FIG. 1 may be used with any processing chamber for plasma or thermal processing. In operation, the semiconductor processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the semiconductor processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Although a plasma-processing chamber may be used for one or more aspects of film processing according to the present technology, in some embodiments, forming molybdenum films may not utilize a plasma-enhanced process. Utilizing plasma may limit conformality of the film produced by further releasing molybdenum from precursors, and which may limit molybdenum incorporation in the films produced by allowing the molybdenum to recombine with other radical species and flow from the chamber. The present technology may at least form the film without plasma generation in some embodiments.

The methods of the present disclosure include depositing molybdenum-containing materials on a substrate, which may be achieved by chemical vapor deposition (CVD), atomic layer deposition (ALD), or plasma-enhanced ALD (PEALD) processes. The molybdenum-containing precursors of the present disclosure are halogen-free molybdenum-containing precursors and are described in more detail below. Generally, the methods of the present disclosure include providing a molybdenum-containing precursor to a processing region of a semiconductor processing chamber where a substrate is disposed; and contacting the substrate with the molybdenum-containing precursor so as to deposit a molybdenum-containing material on the substrate.

Figure 2:
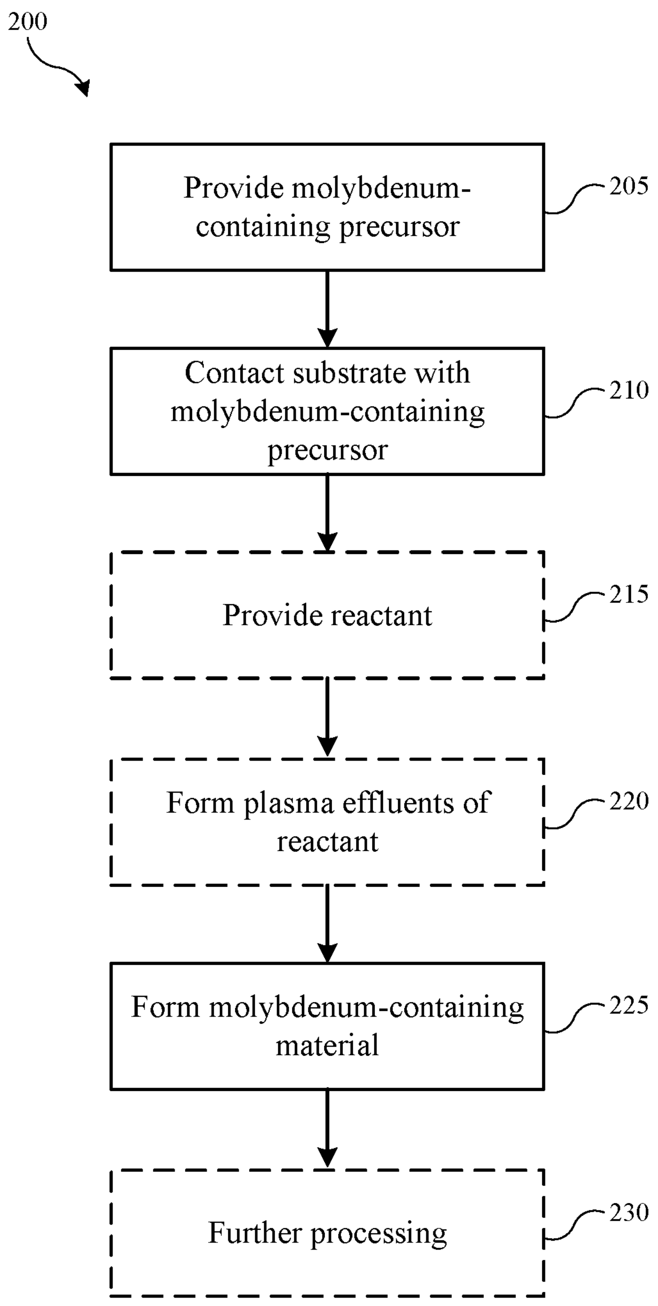
FIG. 2 shows operations in a semiconductor processing method according to some embodiments of the present technology.
Figure 3A:
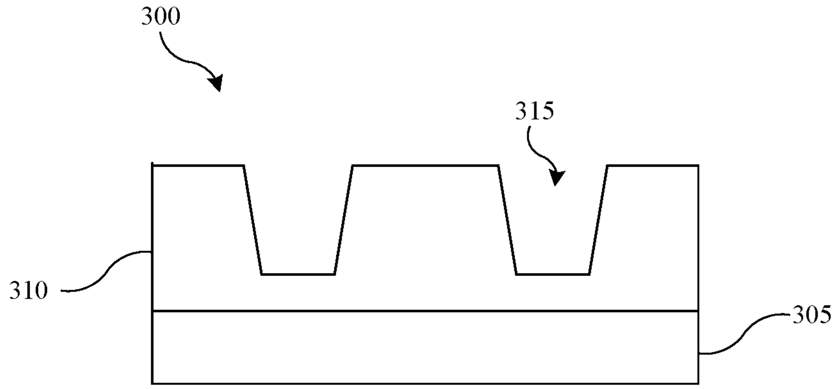
FIGS. 3A-3B show exemplary schematic cross-sectional structures in which material layers are included and produced according to some embodiments of the present technology.
Figure 3B:
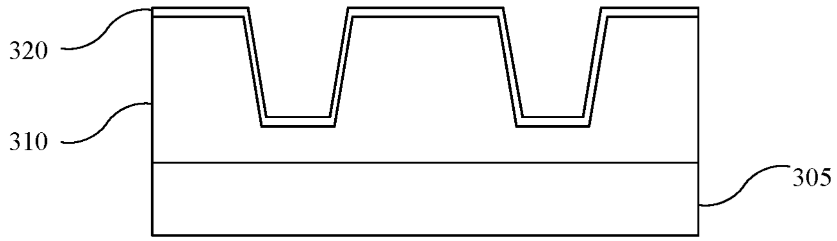

FIG. 2 shows operations of an exemplary method 200 of semiconductor processing according to some embodiments of the present technology. The method may be performed in a variety of processing chambers, including the semiconductor processing chamber 100 described above, as well as any other chamber in which plasma deposition may be performed. Method 200 may include a number of optional operations, which may or may not be specifically associated with some embodiments of methods according to the present technology. It is to be understood that method 200 may be performed on any number of semiconductor structures or substrates, including exemplary structure 300 or substrate 305 as illustrated in FIGS. 3A-3B on which layers of material may be formed. It is to be understood that FIGS. 3A-3B illustrate only partial schematic views, and a substrate may contain any number of structural sections having aspects as illustrated in the figures, as well as alternative structural aspects that may still benefit from operations of the present technology.

Method 200 may include a number of optional operations as illustrated, which may or may not be specifically associated with some embodiments of methods according to the present technology. For example, many of the operations are described in order to provide a broader scope of the structural formation, but are not critical to the technology, or may be performed by alternative methodology as will be discussed further below. As previously discussed, method 200 may describe operations shown schematically in FIGS. 3A-3B, the illustrations of which will be described in conjunction with the operations of method 200.

Prior to the first operation of the method 200, the substrate 305 may be processed in one or more ways before being placed within a processing region of a semiconductor processing chamber 100 in which method 200 may be performed. Some or all of the operations may be performed in chambers or system tools as previously discussed, or may be performed in different chambers on the same system tool, which may include the semiconductor processing chamber in which the operations of method 200 may be performed.

The methods may include providing a molybdenum-containing precursor to a processing region of a semiconductor processing chamber 100 at operation 205. Substrate 305 may be disposed within the processing region of the semiconductor processing chamber 100. Substrate 305 may have a substantially planar surface or an uneven surface in embodiments. As illustrated in FIG. 3A substrate 305 may be processed to form one or more features 315, which may be recessed, such as trenches, apertures, or any other structure in semiconductor processing. The substrate may be a material such as crystalline silicon, silicon oxide, strained silicon, silicon germanium, doped or undoped polysilicon, doped or undoped silicon wafers, patterned or non-patterned wafers, silicon on insulator, carbon doped silicon oxides, silicon nitride, doped silicon, germanium, gallium arsenide, or sapphire. The substrate 305 may have various dimensions, such as 200 mm or 300 mm diameter wafers, as well as rectangular or square panels. In embodiments, one or more layers of material 310 may be deposited on the substrate 305.

A flow rate of the molybdenum-containing precursor to the processing region of the semiconductor processing chamber 100 may be less than or about 1,500 sccm, and may be less than or about 1,400 sccm, less than or about 1,300 sccm, less than or about 1,250 sccm, less than or about 1,200 sccm, less than or about 1,100 sccm, less than or about 1,000 sccm, less than or about 900 sccm, less than or about 800 sccm, less than or about 700 sccm, less than or about 600 sccm, less than or about 500 sccm, or lower.

The molybdenum-containing precursor may be provided to the processing region of the semiconductor processing chamber 100 with a carrier gas. In some embodiments, the carrier gas is an inert gas (e.g., $N_2$, Ar, He, or any combination thereof).

The method 100 also includes contacting the substrate with the molybdenum-containing precursor at operation 210. As a result of said contacting in operation 210 or with additional intervening operations (e.g., operations 215 and 220 described herein), the method 100 includes forming a molybdenum-containing material 320 on the substrate at operation 225. As illustrated in FIG. 3B, the molybdenum-containing material 320 is a liner on the features 315 of the substrate. Said liner extends across the one or more layers of material 310 and within the one or more features 315. Said method 100 may be used for depositing molybdenum-containing material in structures, layers, and the like other than a liner. It should be noted that "depositing on the substrate" encompasses depositing on features, layers, or the like that are already present on the substrate.

As previously discussed, some or all of the formation operations may be performed while the substrate processing region is maintained plasma-free. For example, a thermal CVD may be performed with the halogen-free molybdenum-containing precursors described herein. In a CVD method, the temperature of the semiconductor processing chamber, the pedestal, or the substrate may be maintained at less than or about 700° C., less than or about 650° C., less than or about 600° C., less than or about 550° C., less than or about 500° C., or less. In embodiments, the temperature of the semiconductor processing chamber, the pedestal, or the substrate may be maintained at greater than or about 200° C., greater than or about 250° C., greater than or about 300° C., greater than or about 350° C., greater than or about 400° C., greater than or about 450° C., greater than or about 500° C., or more, which may facilitate thermal decomposition of the molybdenum-containing precursors (and reactants if present), allowing the plasma-free deposition to be performed.

As previously discussed, intervening operations may optionally be included between operation 210 and operation 225. In FIG. 2, two intervening operations 215 and 220 are illustrated. Other operations may be included in addition to or in alternate of one or more of said operations 215 and 220.

For example, in addition to providing the molybdenum-containing precursor in operation 205, the method 200 may include operation 210, which provides a reactant to the processing region of the semiconductor processing chamber 100. The reactant may react with the molybdenum-containing precursor to form the molybdenum-containing material. Alternatively, a second intervening operation 220 may be included in the method 200 that forms plasma effluents of the reactant to react with the molybdenum-containing precursor to form the molybdenum-containing material. Therefore, while FIG. 2 illustrates two intervening operations 215 and 220, alternate embodiments may include neither operation 215 and 220 or may include only operation 215.

A flow rate of the reactant to the processing region of the semiconductor processing chamber 100 may be greater than or about 700 sccm, and may be greater than or about 800 sccm, greater than or about 900 sccm, greater than or about 1,000 sccm.

The reactant may be an oxidizing agent or a reducing agent. Examples of reactants may include, but are not limited to, oxygen ($O_2$), ozone ($O_3$), peroxides, water ($H_2O$), hydrogen ($H_2$), alcohols, ammonia ($NH_3$), 1,1-dimethylhydrazine (DMH), alkyl amine (e.g., tert-butyl amine ($tBuNH_2$), isopropyl amine ($iPrNH_2$), ethylamine ($CH_3CH_2NH_2$), diethylamine ($(CH_3CH_2)_2NH$), or butyl amine ($BuNH_2$)), hydrazine, alkyl hydrazine, allyl hydrazine, nitrous oxide ($N_2O$), nitrogen dioxide ($NO_2$), N-oxides (e.g., $Me_3NO$, TEMPO), P-oxide (e.g., $Et_3PO$), S-oxides, the like, and any combination thereof.

The reactant may be provided to the processing region of the semiconductor processing chamber 100 with a carrier gas. In some embodiments, the carrier gas is an inert gas (e.g., $N_2$, Ar, He, or any combination thereof).

In operation 220, the plasma power may be about 2500 Watts (W) or less, about 2000 W or less, about 1750 W or less, about 1500 W or less, about 1250 W or less, about 1000 W or less, about 1 W to about 2500 W, about 1 W to about 500 W, about 100 W to about 2500 W, about 100 W to about 1000 W, about 500 W to about 2500 W, or about 1000 W to about 2500 W.

While FIG. 2 illustrates operations 205, 210, 215, and 220 in series, two or more of the operations may be performed simultaneously. For example, after operations 205 and 210, operations 215 and 220 may be performed simultaneously. Alternatively, operations 205 and 215 may be performed simultaneously. That is, both the molybdenum-containing precursor and the reactant may be provided to the processing region of the semiconductor processing chamber 100 simultaneously.

When operations are performed in series, the operations may be iteratively repeated. For example, operations 205 and 210 may be performed followed by operations 215 and 220 followed again by operations 205 and 210 and again followed by operations 215 and 220, and so on.

A pressure within the processing region of the semiconductor processing chamber 100 during operations 205, 210, 215, and 220 (or any other operations) may independently be maintained at about 500 Torr or less while forming the molybdenum-containing material. Accordingly, pressure within the semiconductor processing chamber 100 for each operation in forming the molybdenum-containing material may independently be maintained at about 500 Torr or less, about 400 Torr or less, about 300 Torr or less, about 200 Torr or less, about 100 Torr or less, about 50 Torr or less, about 1 Torr to about 500 Torr, about 1 Torr to about 50 Torr, about 10 Torr to about 100 Torr, about 50 Torr to about 250 Torr, or about 100 Torr to about 500 Torr.

A temperature within the processing region of the semiconductor processing chamber 100 during operations 205, 210, 215, and 220 (or any other operations) may independently be maintained at about 700° C. or less, about 650° C. or less, about 600° C. or less, about 550° C. or less, about 500° C. or less, about 20° C. or to about 700° C., about 20° C. or to about 300° C., about 50° C. or to about 400° C., about 150° C. or to about 450° C., about 250° C. or to about 550° C., or about 400° C. or to about 700° C.

The method 200 may include further processing at optional operation 230. For example, operation 230 may include back-end processing, deposition, etching, polishing, cleaning, or any other operations that may be performed subsequent to the described operations.

Figure 4A:
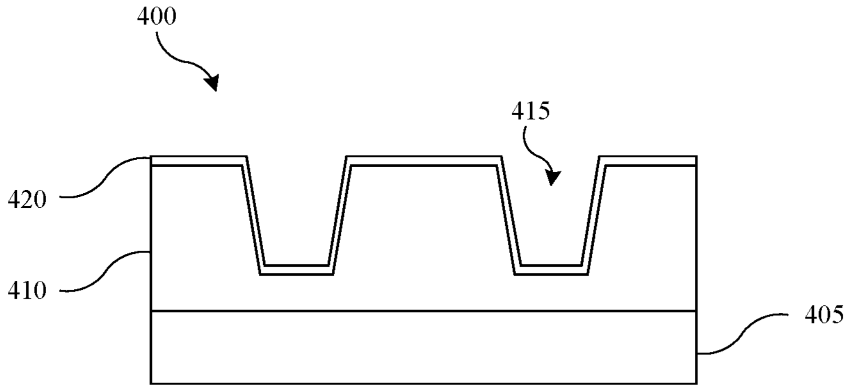
FIGS. 4A-4B show exemplary schematic cross-sectional structures in which material layers are included and produced according to some embodiments of the present technology.
Figure 4B:
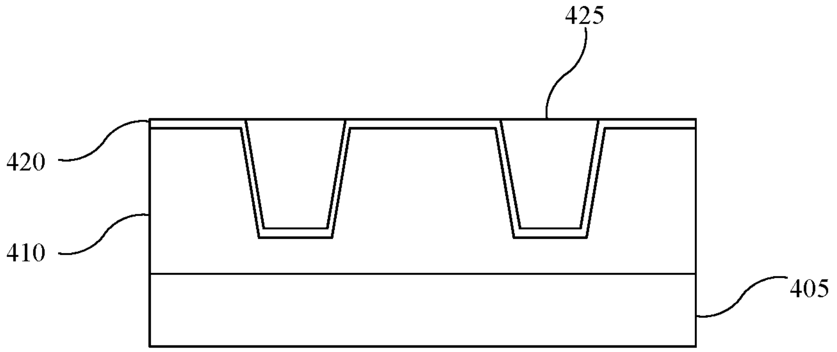

As previously discussed, the molybdenum-containing material may be deposited on the substrate in a different structure than illustrated in FIGS. 3A-3B. For example, FIGS. 4A-4B show schematic illustrations of a different structure of the molybdenum-containing material that may be deposited on a substrate 405. FIG. 4A illustrates an exemplary structure 400 that includes a substrate 405 that may be processed to form one or more layers of material 410 thereon that define one or more features 415, which may be recessed, such as trenches, apertures, or any other structure in semiconductor processing. On the one or more layers of material 410 may be a liner 420 extending across the one or more layers of material 410 and within the one or more features 415. Methods of the present disclosure (e.g., method 200 or alternatives thereof) using the halogen-free molybdenum-containing precursors described herein may be used to deposit a molybdenum-containing material 425 on the liner 420 and within the one or more features 415, as illustrated in FIG. 4B.

The molybdenum-containing material formed by the methods of the present disclosure may be molybdenum metal, molybdenum oxide, molybdenum nitride, molybdenum carbide, molybdenum silicide, or molybdenum sulfide. The composition of the molybdenum-containing material depends on the conditions of the method for forming the molybdenum-containing material and the composition of reactants (if present).

The molybdenum-containing material formed by the methods of the present disclosure may be in the form of a layer characterized by a thickness of about 1 Å to about 3000 Å, about 1 Å to about 100 Å, about 1 Å to about 10 Å, about 5 Å to about 1000 Å, about 5 Å to about 100 Å, about 10 Å to about 150 Å, about 50 Å to about 500 Å, about 250 Å to about 750 Å, about 500 Å to about 1000 Å, about 750 Å to about 1500 Å, about 1000 Å to about 3000 Å, or about 2000 Å to about 3000 Å.

Halogen-Free Molybdenum-Containing Precursor Compositions and Synthesis

Halogen-free molybdenum-containing precursors described herein include molybdenum complexes with aminoalcohol ligands. The molybdenum complex may include a central molybdenum with two double bonded oxygens and two aminoalcohol ligands (total of four oxygens in the complex). Without being limited by theory, it is believed that the presence of the nitrogen, because it coordinates to the molybdenum, stabilizes the molybdenum complex and mitigates the formation of dimer and trimer complexes. In contrast, an alcohol (e.g., isopropanol) may not rely more on steric hindrance to mitigate two or more molybdenums coordinating to form dimer and trimer complexes.

The aminoalcohol ligands preferably form a 5-member or 6-member ring with the molybdenum bound to the oxygen and coordinated to the nitrogen. Without being limited by theory, it is believed that the 5-member or 6-member ring provides a conformationally stable structure that allows the nitrogen to coordinate with the molybdenum to which the oxygen of the ligand is attached, which may mitigate the formation of dimer and trimer complexes.

The halogen-free molybdenum-containing precursors described herein may, for example, include compounds according to Compound I:

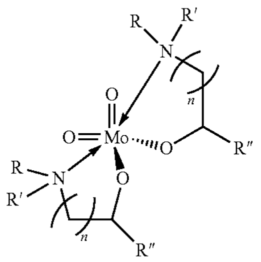

wherein R is methyl or ethyl, R' is methyl or ethyl, R" is hydrogen, methyl, ethyl, or propyl, and n equals 1 or 2. Without being limited by theory, it is believed that the R and R' groups being methyl or ethyl, independently, provide steric hindrance to mitigate the formation of dimer and trimer complexes.

Specific examples of halogen-free molybdenum-containing precursors described herein include, but are not limited to the following compounds.

Compound IA

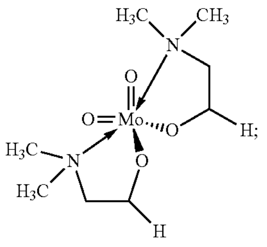

-continued

Compound IB

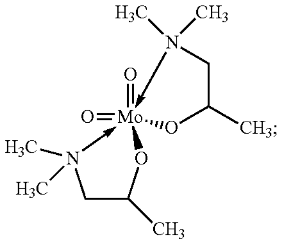

Compound IC

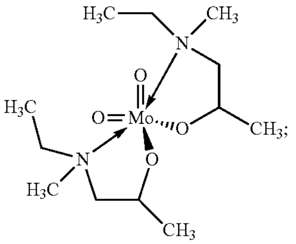

Compound ID

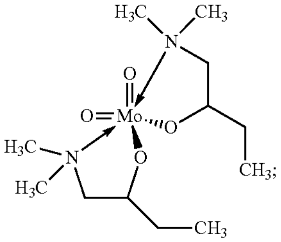

Compound IE

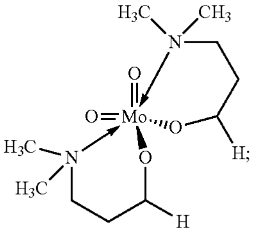

Compound IF

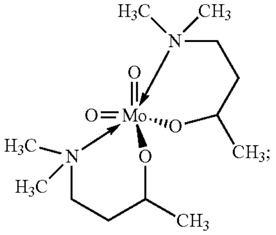

Compound IG

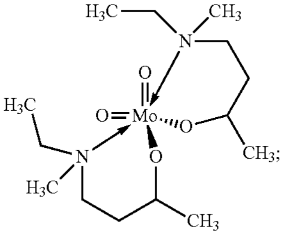

and

-continued

Compound IH

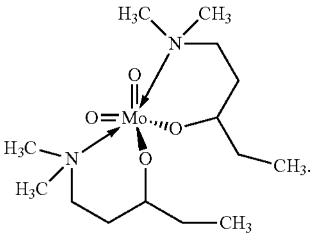

Synthesis of the halogen-free molybdenum-containing precursors described herein may be by any suitable reaction scheme. For example, synthesis of a halogen-free molybdenum-containing precursor may be according to Scheme I:

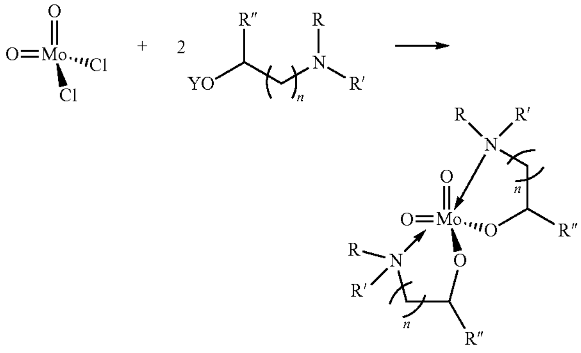

wherein Y is an alkali metal (e.g., Li, Na, K, Rb, or Cs, preferably Li), X is a halogen (e.g., F, Cl, Br, or I, preferably Cl), R is methyl or ethyl, R' is methyl or ethyl, R" is hydrogen, methyl, ethyl, or propyl, and n equals 1 or 2.

The reaction in Scheme I may be performed in a dry, organic solvent. As used herein, "dry" when referring to a solvent means that less than 1 ppm of water is present in the solvent. Examples of solvents may include, but are not limited to, dimethoxyethane (DME), diethylether, tetrahydrofuran (THF), 1,4-dioxane, pentane, the like, and any combination thereof.

A reaction temperature for the reaction in Scheme I may be about 0° C. to about 50° C., about 0° C. to about 30° C., about 10° C. to about 40° C., or about 20° C. to about 50° C.

A reaction time for the reaction in Scheme I may be about 1 hour to about 36 hours, about 1 hour to about 12 hours, about 6 hours to about 18 hours, or about 12 hours to about 36 hours.

The reaction in Scheme I may be carried out by a variety of procedures. For example, the $MO_2X_2$ and the Y—O—CH(R")—$(CH_2)_n$—NR(R') may be separately dissolved in dry, organic solvents, then mixed. The addition of one reactant to the other in the mixing may be all at once or over time (e.g., separate additions over time or continuously (e.g., dropwise) over time). The addition of one reactant to the other may occur over a time of about 1 minute to about 3 hours or longer, about 1 minute to about 30 minutes, about 10 minutes to about 90 minutes, or about 1 hour to about 3 hours. The amount of time may depend on a variety of factors including the volume of the solution to be added.

After the reaction is completed, the product may be isolated by conventional procedures. For example, at the conclusion of the reaction time, the mixture may be filtered to isolate product. Optionally, depending on the solubility of the product in the solvent, a precipitating agent (e.g., a precipitating solvent that is miscible with the reaction solvent where the product has lower solubility in the precipitating solvent) may be added to the mixture. The solid product collected during filtration may be washed and dried.

A nonlimiting example procedure for performing the reaction in Scheme I and isolating Compound I may include adding a 1 mmol solution of Y—O—CH(R")—$(CH_2)_n$—NR(R') in DME dropwise to a 0.5 mmol solution of $MO_2X_2$ in DME with continuous stirring. The dropwise addition may take 5 minutes to 1 hour. The mixture may then be allowed to react (have a reaction time) of about 6 hours to about 24 hours. Then, the resultant mixture may be filtered, washed with an organic solvent, and dried (e.g., under reduced pressure). Further purification may be performed.

The halogen-free molybdenum-containing precursors described herein may be characterized by a vapor pressure at 100° C. of about 0.1 Torr to about 1 Torr, about 0.1 Torr to about 0.5 Torr, about 0.3 Torr to about 0.7 Torr, or about 0.5 Torr to about 1 Torr.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a molybdenum-containing precursor" includes a plurality of such precursors, and reference to "the molybdenum-containing material" includes reference to one or more materials and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A molybdenum complex comprising Compound I:

Compound I

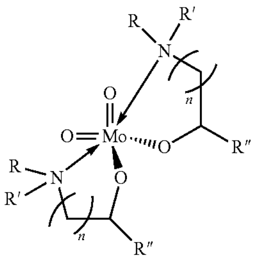

wherein R is methyl or ethyl, R' is methyl or ethyl, R" is hydrogen, methyl, ethyl, or propyl, and n equals 1 or 2.

2. The molybdenum complex of claim 1, wherein R is methyl, R' is methyl, R" is hydrogen, and n equals 1.

3. The molybdenum complex of claim 1, wherein R is methyl, R' is methyl, R" is hydrogen, and n equals 2.

4. The molybdenum complex of claim 1, wherein the molybdenum complex has a vapor pressure at 100° C. of 0.1 Torr to 1 Torr.

5. A method of depositing a film, the method comprising:

i) providing a molybdenum-containing precursor to a processing region of a semiconductor processing chamber, wherein a substrate is disposed within the processing region of the semiconductor processing chamber, and wherein the molybdenum-containing precursor comprises a molybdenum complex according to Compound I:

Compound I

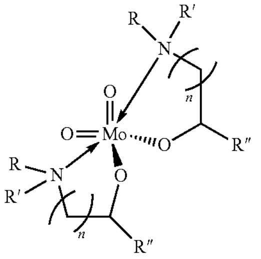

wherein R is methyl or ethyl, R' is methyl or ethyl, R" is methyl, ethyl, or propyl, and n=1 or 2; and ii) contacting the substrate with the molybdenum-containing precursor, wherein the contacting deposits a molybdenum-containing material on the substrate.

6. The method of claim 5, wherein the molybdenum-containing precursor is halogen-free.

7. The method of claim 5, wherein the molybdenum-containing material comprises molybdenum metal, molybdenum oxide, molybdenum nitride, molybdenum carbide, molybdenum silicide, or molybdenum sulfide.

8. The method of claim 5, further comprising:

repeating operations i and ii iteratively to build the molybdenum-containing material to a thickness of 1 Å to 3000 Å.

9. The method of claim 5, further comprising:

iii) providing a reactant to the processing region of the semiconductor processing chamber to react with the molybdenum-containing precursor to form the molybdenum-containing material.

10. The method of claim 9, wherein operations i and ii are performed simultaneously.

11. The method of claim 9, wherein operations i and ii are performed sequentially.

12. The method of claim 9, wherein the reactant comprises an oxidant.

13. The method of claim 5, further comprising:

iii) providing a reactant to the processing region of the semiconductor processing chamber; and iv) forming plasma effluents of the reactant to react with the molybdenum-containing precursor to form the molybdenum-containing material.

14. The method of claim 5, further comprising:

iii) annealing the molybdenum-containing material.

15. The method of claim 5, wherein the molybdenum-containing material extends into one or more features defined by the substrate.

16. A method of forming a molybdenum complex, the method comprising:

reacting Y—O—CH(R")—$(CH_2)_n$—NR(R') where Y is an alkali metal and $MoO_2X_2$ where X is a halogen in a dry, organic solvent to produce the molybdenum complex according to Compound I:

Compound I

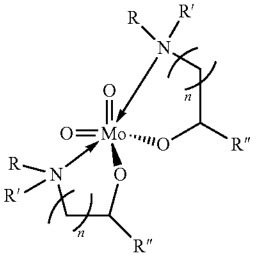

wherein R is methyl or ethyl, R' is methyl or ethyl, R" is methyl, ethyl, or propyl, and n=1 or 2.

17. The method of claim 16, wherein conditions of the reacting include a reaction temperature of 0° C. to 50° C. and a reaction time of 1 hour to 36 hours.

18. The method of claim 16, further comprising:

adding the Y—O—CH(R")—$(CH_2)_n$—NR(R') over time to the $MoO_2Cl_2$.

19. The method of claim 18, wherein the time is 5 minutes to 2 hours.

20. The method of claim 16, further comprising:

filtering a product of the reacting; and washing and drying the product to produce crystals comprising the molybdenum complex.

* * * * *